(12) United States Patent
Zhang et al.

(10) Patent No.: US 11,355,485 B2
(45) Date of Patent: Jun. 7, 2022

(54) SEMICONDUCTOR DIE AND SEMICONDUCTOR PACKAGE

(71) Applicant: WESTERN DIGITAL TECHNOLOGIES, INC., San Jose, CA (US)

(72) Inventors: Yazhou Zhang, Shanghai (CN); Chin-Tien Chiu, Taichung (TW); Shineng Ma, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 120 days.

(21) Appl. No.: 16/818,426

(22) Filed: Mar. 13, 2020

(65) Prior Publication Data

US 2020/0411496 A1 Dec. 31, 2020

(30) Foreign Application Priority Data

Jun. 28, 2019 (CN) .......................... 201910575624.9

(51) Int. Cl.
*H01L 25/18* (2006.01)
*H01L 25/065* (2006.01)
*H01L 25/00* (2006.01)

(52) U.S. Cl.
CPC .......... *H01L 25/18* (2013.01); *H01L 25/0657* (2013.01); *H01L 25/50* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06548* (2013.01); *H01L 2225/06558* (2013.01); *H01L 2225/06562* (2013.01); *H01L 2225/06586* (2013.01)

(58) Field of Classification Search
CPC ........................................... H01L 2225/06562
See application file for complete search history.

(56) References Cited

U.S. PATENT DOCUMENTS

2020/0091102 A1* 3/2020 Aoki ....................... H01L 24/20
2020/0350425 A1* 11/2020 Dutta .................. H01L 21/8258

* cited by examiner

*Primary Examiner* — Yu-Hsi D Sun
(74) *Attorney, Agent, or Firm* — Vierra Magen Marcus LLP

(57) ABSTRACT

A semiconductor die is provided. The semiconductor die includes: at least one complementary metal oxide semiconductor (CMOS) circuit module electrically coupled to at least one memory die, the at least one memory die being separated from the semiconductor die; and a controller module electrically coupled to the CMOS circuit module and configured to control the at least one CMOS circuit module and the at least one memory die. A semiconductor package is also provided.

20 Claims, 20 Drawing Sheets

SEMICONDUCTOR DIE AND SEMICONDUCTOR PACKAGE

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

With the demand for smaller electronic devices, semiconductor packages can be designed to connect a die to an external system via an electronic interface to enable more compact electronic devices and support greater circuit density.

DETAILED DESCRIPTION

Figure 1:
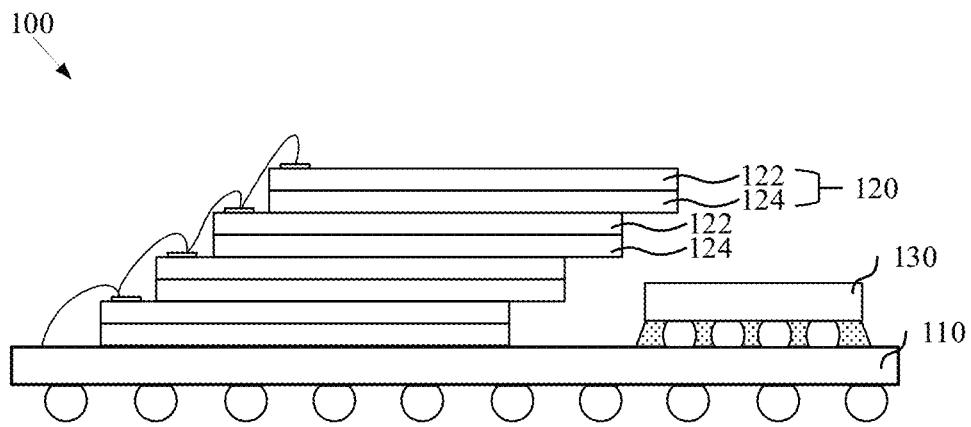
FIG. 1 is a schematic side view of a memory package.

The technical solutions of the embodiments of the present invention will be clearly and completely described in the following with reference to the accompanying drawings. It is apparent that the described embodiments are part of the embodiments of the invention, but not all the embodiments. All other embodiments obtained by a person of ordinary skill in the art based on the described embodiments of the invention, without departing from the scope of the invention, are within the scope of the invention. The same reference numerals are used for the same features, and the drawings are not to scale.

Unless otherwise defined, technical or scientific terms used herein shall be taken in the ordinary meaning as understood by one of ordinary skill in the art. The words "first", "second" and similar terms used in the specification and claims of the invention may be used to describe various elements, components, regions, layers, steps and/or sections, but does not define any order, quantity, or importance. These words are only used to distinguish between one or more of elements, components, regions, layers, steps, and/or segments. Similarly, the words "a" or "an" and the like are not intended to define a quantity limitation, but intended to define the existence of at least one.

Spatially related terms such as "on", "under", "upper", "lower", "above", "below", "over", "beneath", etc., may be used herein to describe the relationship between one element or feature and another one or more elements or features as illustrated in the figures, for ease of description. These spatially related terms are intended to encompass different orientations of the device in use or operation, in addition to the orientation depicted in the figures. For example, if the device is turned over, a certain element or feature described as "under", "below" or "beneath" another element or feature would orient above another element. In addition, it will be interpreted that when an element or feature is described as "between" two elements and features, the element and feature can be understood as the only one element or feature between the two elements and features, or there are also one or more intervening elements or features. It will also be interpreted that when an element or feature is described as "on", "connected to", "coupled to", "attached to" another element or feature, it can be directly "on", "connected to", "coupled to", "attached to" another element or feature, or one or more intervening element or feature can also be present. In contrast, when an element or feature is described as "directly on", "directly connected to", "directly coupled to", "directly attached to" another element or feature, there is no intervening element or feature.

As will be appreciated by those skilled in the art, these components, devices, apparatuses, systems can be connected, arranged, and configured in any manner. Words such as "including", "comprising", "having", and the like, should be interpreted as "including but not limited to" and may be used interchangeably. The terms "or" and "and" are used herein to mean the term "and/or" and are used interchangeably unless the context clearly indicates otherwise. As used herein, "such as" refers to the phrase "such as but not limited to" and is used interchangeably.

In addition, the use of "or" in the listing of the items beginning with "at least one" indicates an enumerated list, such that an enumeration such as "at least one of A, B or C" means A or B or C, or AB or AC or BC, or ABC (i.e., A and B and C). Furthermore, the word "exemplary" is used to indicate a schematic description and does not mean that the described examples are preferred or better than the other examples.

Hereinafter, the embodiments will be described in detail with reference to the accompanying drawings.

FIG. 1 is a schematic side view of a memory package.

As shown in FIG. 1, the memory package 100 includes a substrate 110 such as a printed circuit board (PCB) and a memory die stack disposed on the substrate 100. The memory die stack includes a plurality of memory dies 120. Each of the memory dies 120 includes a memory circuit 122 and a CMOS circuit layer 124. The memory die stack package further includes a controller 130 disposed on the substrate 110 and is close to the memory die stack 120. The memory dies 120 are electrically coupled to the controller 130 through the substrate 110.

As 3D integration density of the memory circuit 122 increases, the CMOS circuits 124 present in the memory die 120 can not only significantly increase fabricating cost, but can also result in significant degradation in thermal performance. For example, because the speed for the CMOS circuit to process data is much faster than the speed for the memory die to access data, resulting in more heat in the memory dies and increased thermal cycling, causing increased thermal stress on the memory die stack.

Figure 2:
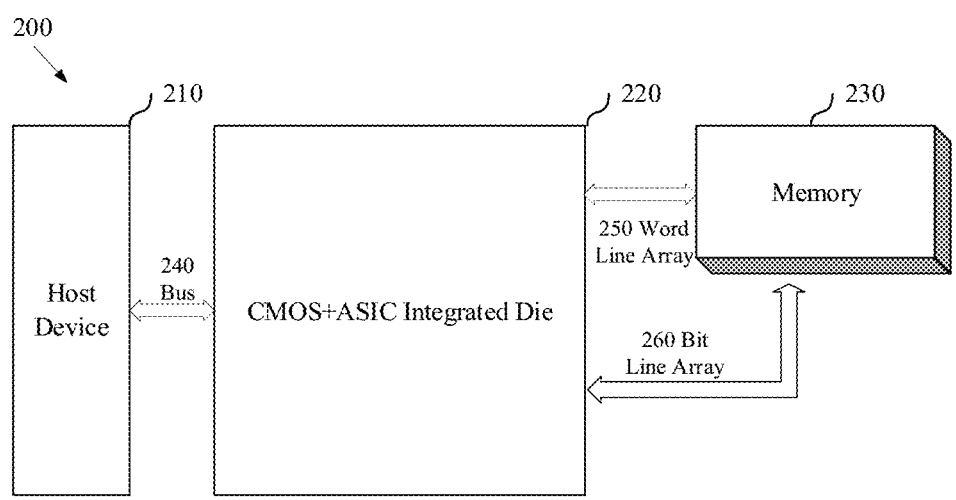
FIG. 2 is a block diagram of a system including a semiconductor die integrating CMOS circuit and controller circuit according to an embodiment.

FIG. 2 is a block diagram of a system including a semiconductor die integrating CMOS circuit and controller circuit according to an embodiment.

In the context, a semiconductor die integrating CMOS circuit and controller circuit is abbreviated as the integrated die or simply called the die, for ease of description.

As shown in FIG. 2, a system 200 includes a host device 210, an integrated die 220, and a memory 230. The integrated die 220 is connected to the host device 210 through a bus 240 and connected to the memory 230 through the word line array 250 and the bit line array 260.

The host device 210 can be any type of computing device including a processor, such as a smart television, set top box, smart stereo, smart phone, desktop computer, laptop computer, netbook computer, tablet computer, on-board computer, a wearable device such as watch, ring, bracelet, or the like, or any other type of computing device. The integrated die 220 (corresponding to die 300 shown in FIG. 3) including a CMOS circuit and a controller circuit will be described in detail below. The memory 230 can be a single memory die, or a memory die stack and/or memory die array including a plurality of memory dies, and also generally referred to as a memory cell array. In the context of the present technology, a memory die stack or a memory cell array can be configured as a NAND memory composed of a plurality of memory strings that are composed of a plurality of memory cells that share a single bit line and are accessed as a group. The memory cells can be a set of memory cells connected in series.

Alternatively, the memory die stack can also be configured as a NOR memory, wherein the memory cells can be configured to be accessible to each memory cell. NAND memory and NOR memory are merely exemplary and may also be configured in other forms of memory cells.

The bus 240 may include Serial Advanced Technology Attachment (SATA), High Speed Peripheral Component Interconnect (PCIe), Universal Flash Storage (UFS), Embedded Multimedia Card (eMMC), or Universal Serial Bus (USB), etc.

Figure 3:
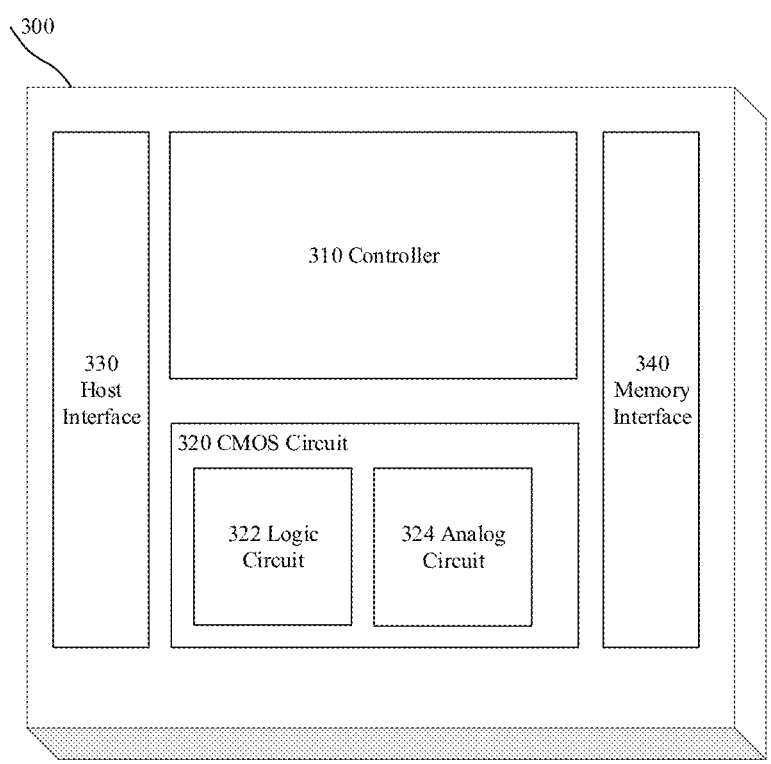
FIG. 3 is a block diagram of a semiconductor die integrating CMOS circuit and controller circuit according to an embodiment.

FIG. 3 is a block diagram of a module of the CMOS circuit and controller integrated die according to embodiments.

Referring to FIG. 3, a semiconductor die 300 integrating CMOS circuit and controller circuit includes a controller module 310 and a CMOS circuit module 320. Specifically, the controller module 310 is electrically coupled to the CMOS circuit module 320 and configured to control the CMOS circuit module 320 and the memory 230 shown in FIG. 2.

The controller module 310 manages the memory 230 by controlling the CMOS circuit module 320 and the memory 230. The controller module 310 can be, for example, an application specific integrated circuit (ASIC). More specifically, the controller module 310 includes at least one of an error check and correction (ECC) module, a volatile memory module such as a dynamic random-access memory (DRAM), a buffer module, a bad block management (BBM) module, and a wear leveling module. The controller module 310 contributes to manage data, bad blocks, bad sectors, etc. in the memory unit, to avoid memory failures or performance degradation, thereby ensuring data security.

The CMOS circuit module 320 is configured to communicate with the memory 230 via control signals output by the memory controller module 310. The control signals include for example address signals of the data transmission and command signals. The CMOS circuit module 320 can include a logic circuit for example a CMOS logic control array (CLA) circuit module 322 and an analog circuit module 324. Specifically, the logic circuit module 322 may also be referred to as a digital logic circuit module. In particular, the logic circuit module 322 can include at least one of input/output logic circuit, address and/or command control logic circuit, drivers, CMOS decoders and multiplexers. The address and/or command control logic circuit can include bit line access and bit line address control logic circuit, word line access and word line address control logic circuit. Specifically, the logic circuit module can refer to an address and/or command control logic for external communication. And the analog circuit module can include at least one of a power supply controller, a sense amplifier, and a clock generator. It should be noted that the CMOS circuit modules such as the address and/or command control logic circuits communicate with the word lines and the bit lines in parallel, and have faster operating speed for data and signals than that of memory 230, so that the data and signals can be provided to the memory more quickly for operations such as access.

The die 300 further includes a host interface 330 and a memory interface 340. The controller module 310 is coupled to the host device 210 shown in FIG. 2 through the host interface 330. The CMOS circuit module 320 is electrically coupled to the memory 230 through the flash memory interface 340, and the controller module 310 is electrically coupled to the memory 230 through the flash memory interface 340. As described above, the memory 230 can be a memory cell array including a plurality of memory dies.

According to the embodiment, the CMOS circuit module including a logic circuit module and/or an analog circuit module and the controller module managing at least one memory die are integrated in a single semiconductor die separated from the memory die. Therefore, the influence of the CMOS circuit on the thermal performance and mechanical performance of each of the memory dies can be significantly reduced. Because the speed for the CMOS circuit to process data and the operating speed of the controller circuit are much faster than the operating speed of the memory die, integrating the CMOS circuit and the controller in one semiconductor die enables more efficient data management operations.

Figure 4A:
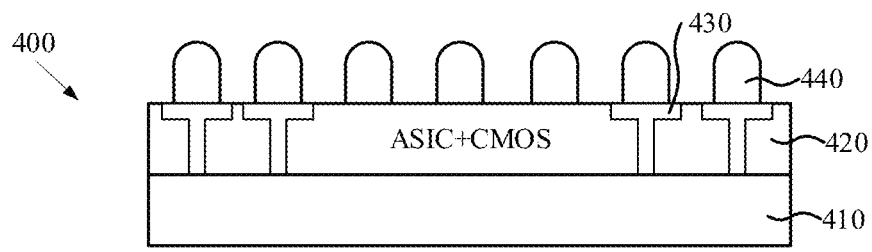
FIG. 4A is a schematic side view of a first embodiment of a semiconductor die integrating CMOS circuit and controller circuit.
Figure 4B:
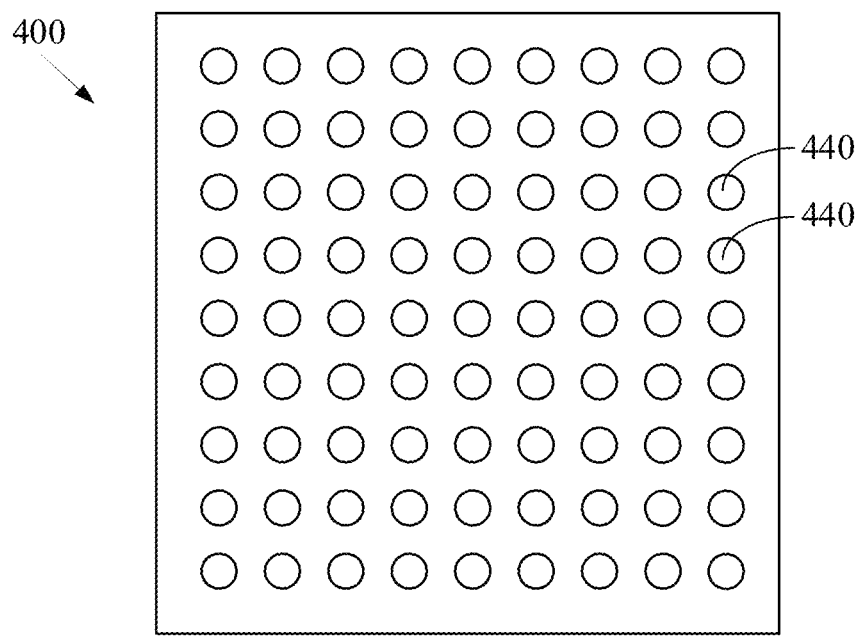
FIG. 4B is a top view of the first embodiment of a semiconductor die integrating CMOS circuit and controller circuit.

FIGS. 4A and 4B are schematic side and top views of a first embodiment of a semiconductor die 400 integrating CMOS circuit and controller circuit, respectively. As shown in FIG. 4A, a semiconductor die 400 integrating CMOS circuit and controller circuit includes a base layer 410, a circuit layer 420 including a CMOS circuit and a controller circuit, output terminals 430, and conductive connectors 440. The base layer 410 can include silicon and provide support for the circuit layer 420 including the CMOS circuit and the controller circuit. As shown, the CMOS circuit and the controller circuit layer 420 are disposed over the base layer 410 and in the same layer. The controller circuit can include for example an application specific integrated circuit (ASIC).

The output terminals 430 are formed over and electrically interconnected with the CMOS and ASIC circuits. Specifically, the output terminals 430 are exposed on the upper surface of the die 400. The conductive connector 440 is formed over each of the output terminals exposed on the upper surface of the die 400, for example in the form of bonding pads. The conductive connectors 440 can be micro-bumps, ball bump array (BGA) solder balls, or the like. As shown in FIG. 4B, in the CMOS circuit and controller integrated die 400, the micro-bumps serving as the conductive connectors 440 can have a cylindrical shape and are arranged in an array. In particular, a size of sectional diameter of the micro-bumps depends on the size of diameter of the exposed output terminals, ie, bonding pads. For example, the size of sectional diameter of the micro-bumps is less than or equal to 50 μm, particularly less than or equal to 20 μm, more particularly less than or equal to 10 μm, and more particularly less than or equal to 5 μm. Depending on the structure of the output terminals, the micro-bumps 440 can be closely arranged, for example, the distance between adjacent micro-bumps is less than or equal to 50 μm, particularly less than or equal to 20 μm, or even less. A material of the micro-bumps 440 includes copper, gold, nickel, tin, lead, silver, platinum, and/or aluminum. More specifically, the material of the micro-bumps may be copper-nickel-tin. The micro-bumps in the present embodiment have the advantages of better electrical conductivity, good heat dissipation performance, better electron migration resistance, high wiring density, and lower cost. The use of the micro-bumps can greatly reduce the package volume of the die and greatly reduce the area of the chip, so as to improve the integration of the electronic device. In addition, such design of the die can also reduce the interference of system parasitic capacitance, and address resistance heating and signal delay issues. In the present embodiment, the CMOS circuit and the controller circuit in the semiconductor die are disposed in the same circuit layer, reducing the complexity of the fabricating process.

Figure 4C:
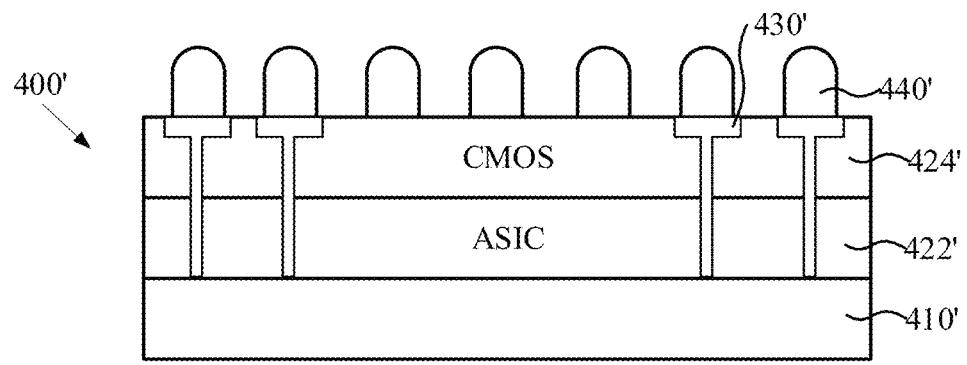
FIG. 4C is a schematic side view of a second embodiment of a semiconductor die integrating CMOS circuit and controller circuit.

FIG. 4C is a schematic side view of a second embodiment of a semiconductor die 400' integrating CMOS circuit and controller circuit. As shown in FIG. 4C, a semiconductor die 400' integrating CMOS circuit and controller circuit includes a base layer 410', an ASIC circuit layer 422', a CMOS circuit layer 424', output terminals 430', and conductive connectors 440'. The ASIC circuit layer 422' and the CMOS circuit layer 424 are arranged on top of each other. For example, the ASIC circuit layer 422' can be disposed between the base layer 410' and the CMOS circuit layer 424', i.e., the CMOS circuit layer 424' is disposed closer to the conductive connector 440' than the ASIC circuit layer 422'. Thus, the communication path between the CMOS circuit layer 424' and the memory dies electrically connected with the CMOS circuit layer 424' through the conductive connectors 440' is shorter. Moreover, the CMOS circuit layer 424' can be communicated with the memory die more efficiently and more quickly by increasing the amount of the conductive connectors. In an alternative embodiment, the ASIC circuit layer 422' can also be disposed over the base layer 410' and the CMOS circuit layer 424'. In the present embodiment, the structures and functions of the base layer 410', the output terminal 430', and the conductive connectors 440' are substantially the same as the base layer 410, the output terminal 430, and the conductive connectors 440 in FIG. 4B, thus the description will not be repeated herein. In the present embodiment, the ASIC circuit layer 422' and the CMOS circuit layer 424 are disposed on top of each another, which further reduces the footprint of the semiconductor die.

Figure 5A:
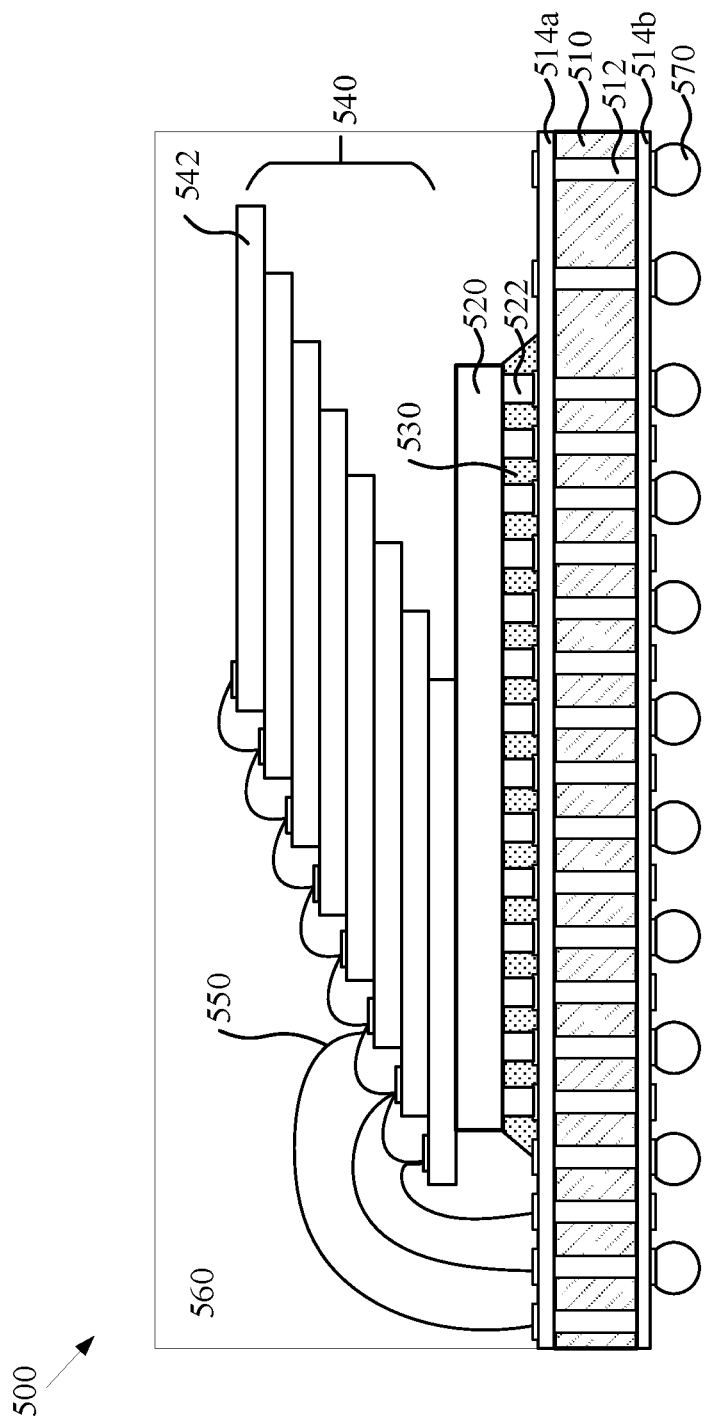
FIG. 5A is a schematic side view of a first embodiment of a semiconductor package.
Figure 5B:
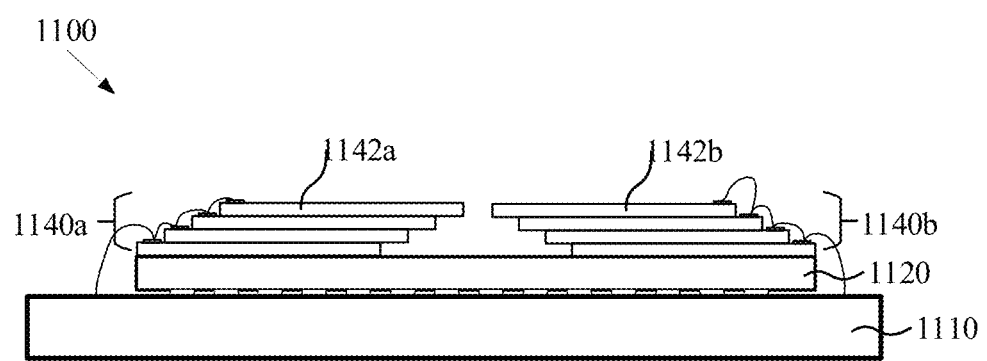
FIG. 5B is a schematic side view of a second embodiment of a semiconductor package.
Figure 6A:
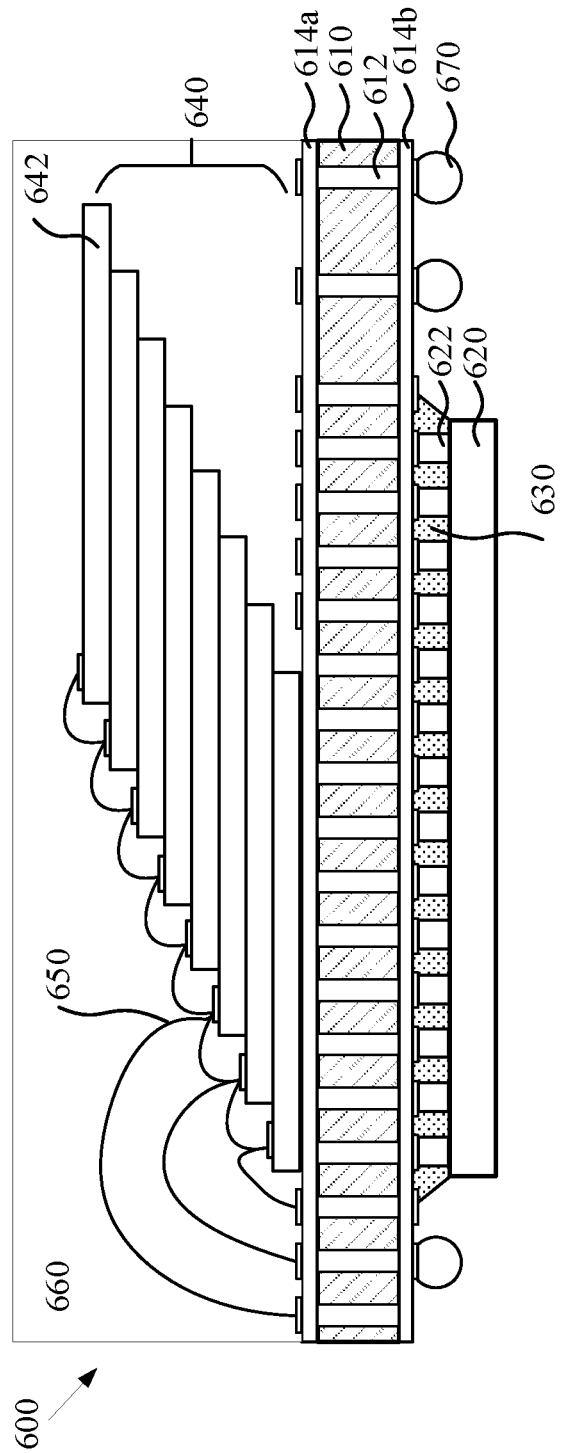
FIG. 6A is a schematic side view of a third embodiment of a semiconductor package.
Figure 6B:
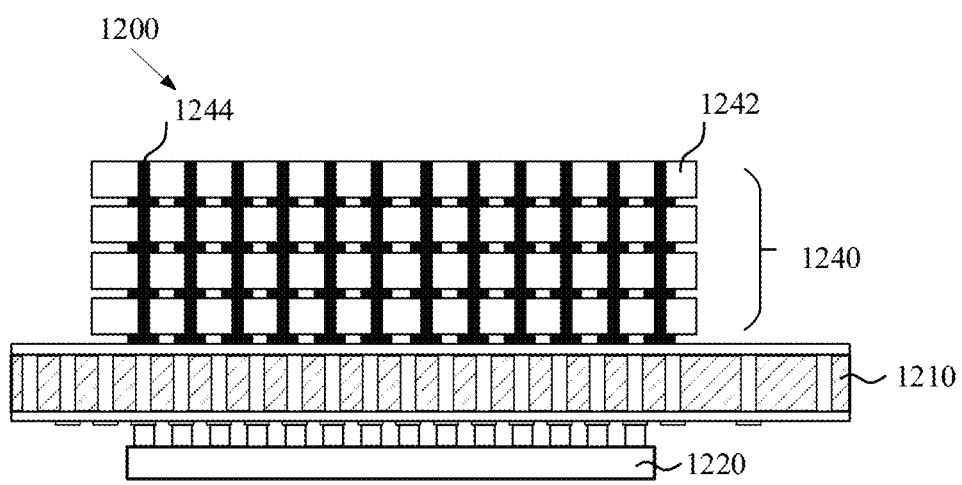
FIG. 6B is a schematic side view of a fourth embodiment of a semiconductor package.

FIGS. 5A and 5B are schematic side views, respectively, of a first embodiment of a semiconductor package and a second embodiment of a semiconductor package where the semiconductor packages are configured as both a hybrid flip chip and memory dies on the same side of the interposer. And FIGS. 6A and 6B are schematic side views, respectively, of a third embodiment of a semiconductor package and a fourth embodiment of a semiconductor package, where the semiconductor packages are configured as both a hybrid flip chip and memory dies on opposite sides of the interposer. FIG. 7 and FIGS. 8A-8H are respectively a flow chart of a method of fabricating a semiconductor package shown in FIG. 5A and a schematic side view of a structure of different stages in the manufacturing method. In addition, FIG. 9 and FIGS. 10A-10F are respectively a flow chart of a method of manufacturing the semiconductor package shown in FIG. 6A and a schematic side view of the structure of the different stages in the manufacturing method.

As shown in FIG. 5, a semiconductor package 500 includes an interposer 510, a semiconductor die 520 integrating CMOS circuit and controller circuit, and a memory die stack 540. The semiconductor package 500 does not include a substrate. In particular, the interposer 510 has a plurality of through silicon vias 512 filled with metal. The interposer 510 has a smaller coefficient of thermal expansion than a conventional substrate, and thus has better thermal and mechanical performance. Additionally, the interposer 510 can include redistribution layers 514a, 514b disposed on the surfaces thereof. Compared with conventional printed circuit boards and substrates having conductive layer(s) etched on one or both sides of a dielectric base, the interposer 510 including through silicon vias 512 has a smaller line width, smaller node pitch, and lower coefficient of thermal expansion (CTE), so that the package is smaller and has better thermal performance.

The die 520 is disposed on the interposer 510 in a flip chip manner. The arrangement and advantages of the die 520 integrating the CMOS circuit and controller circuit are substantially the same as those of the die 400 and 400' as shown in FIGS. 4A and 4C, and thus the description is not repeated herein. It is noted that the controller circuit, the CMOS circuit, and the output terminals are omitted here, and only the conductive connectors 522 are shown. In particular, the conductive connectors 522 can be micro-bumps disposed on the redistribution layer 514a of the interposer 510. The arrangement of the smaller micro-bumps can reduce the footprint area and volume of the package and improve the integration of the package. The composition and advantages of the micro-bumps can be as described above.

The memory die stack 540 is disposed on the die 520. The memory die stack 540 includes a plurality of memory dies 542 stacked in a stepped manner, and each of the memory dies 542 does not include CMOS circuits. The memory dies without CMOS circuits are easier to be implemented as a three-dimensional memory die with increasing memory density. The die 520 can be larger than the conventional controller die, so that the die 520 can support the memory die stack independently and stably without other supports such as spacers disposed around the controller die.

In addition, the semiconductor package 500 may further include an underfill layer 530, an electrical interconnect 550, a molding compound 560, and solder balls 570. In particular, the underfill layer 530 is disposed between the die 520 and the redistribution layer 514a of the interposer 510 and covers all of the conductive connectors 522. The underfill layer 530 reduces the stress caused by the difference in thermal expansion coefficients between the die 520 and the interposer 510, which in turn improves the reliability of the package structure. Specifically, a material of the underfill layer may further include a molded underfill, a capillary underfill, a non-conductive paste, a non-conductive film, and combinations thereof.

Additionally, the semiconductor package 500 may further include electrical interconnectors 550 disposed between the memory die stack 540 and the interposer 510. As shown, the memory die stack 540 can be coupled to the redistribution layer 514a of the interposer 510 through the electrical interconnectors 550 such as wire bonds. It is conceivable that the wire bonds are merely exemplary. In alternative embodiments, other electrical interconnectors may also be selected, such as solder, micro-bumps, through silicon vias, and the like. A material of the wire bonds can include gold, aluminum, or the like.

The semiconductor package 1100 shown in FIG. 5B is substantially the same as the semiconductor package 500 shown in FIG. 5A, and only the different portions of these two semiconductor packages are described below, and the same portions will not be repeated herein.

As shown in FIG. 5B, the semiconductor package 1100 includes an interposer 1110, an semiconductor die 1120 integrating the CMOS circuit and controller circuit, and memory stacks 1140a, 1140b.

The die 1120 has a controller circuit and a CMOS circuit, wherein the controller circuit can simultaneously manage the two memory stacks 1140a, 1140b. More specifically, the CMOS circuit such as CMOS logical array circuit can control the command and bit line addresses and word line addresses in the two memory stacks 1140a, 1140b for external communication. In further embodiments, the die 1120 may also manage and control three or more memory stacks and be disposed above the interposer 1110 to realize a memory with greater storage capacity. The memory stacks 1140a, 1140b are disposed on the die 1120. The memory stack 1140a, 1140b can include a plurality of stacked memory dies 1142a, 1142b in a stepped manner. The stacked manner in the figure is merely exemplary, and may also include a stacked manners by offsetting in any direction.

As shown in FIG. 6A, a semiconductor package 600 includes an interposer 610, a semiconductor die 620 integrating CMOS circuit and controller circuit, and a memory die stack 640. The semiconductor package 600 does not include a substrate. Similarly, the interposer 610 has a plurality of through silicon vias 612 filled with metal. Additionally, the interposer 610 further includes redistribution layers 614a, 614b disposed on both surfaces of the interposer, respectively. Compared with conventional printed circuit boards and substrates, the interposer 610 including through silicon vias 612 has a smaller line width, smaller node pitch, and lower coefficient of thermal expansion (CTE), so that the package is smaller and has better thermal performance.

The die 620 is disposed on the interposer 610 in a flip chip manner. The arrangement of the die 620 are substantially same as those of the die 400 and 400' as shown in FIGS. 4A and 4C, and thus the description will not be repeated herein. It is noted that the controller circuit, the CMOS circuit, the output terminals are omitted here, and only the conductive connectors 622 are shown. In particular, the conductive connectors 622 can be micro-bumps disposed on the redistribution layer 614b of the interposer 610.

The memory die stack 640 is disposed on the redistribution layer 614b of the interposer 610 on the opposite side of the interposer 610 with respect to the die 620. The memory die stack 640 includes a plurality of memory dies 622 stacked in a stepped manner, and each of the memory dies 642 does not include CMOS circuits.

The semiconductor package 600 can further include electrical interconnectors 650, a molding compound 660, an underfill layer 630, and solder balls 670. Electrical interconnectors 650 are disposed between the memory die stack 640 and the interposer 610. As shown, the memory die stack 640 can be coupled to the redistribution layer 614a of the interposer 610 through the electrical interconnectors 650 such as wire bonds as shown. It is conceivable that the wire bonds are merely exemplary. In alternative embodiments, other electrical interconnectors can also be selected, such as solder, micro-bumps, through silicon vias, and the like.

Additionally, the molding compound 660 encapsulates the memory die stack 640 disposed on the interposer 610. The molding compound 660 can be composed of an epoxy material. In alternative embodiments, the molding compound 660 can include materials such as high molecular polymers including epoxy resins and phenol resins, fused silica, carbon black, and/or metal hydroxides. Further, the molding compound 660 can protect the semiconductor package 600 from environmental influences such as temperature, humidity, contaminants, and the like.

The underfill layer 630 is disposed between the die 620 and the redistribution layer 614a of the interposer 610 and covers all of the conductive connectors 622. The underfill layer 630 reduces the stress caused by the difference in thermal expansion coefficients between the die 620 and the interposer 610, which in turn improves the reliability of the package structure. Specifically, a material of the underfill layer may further include a molded underfill, a capillary underfill, a non-conductive paste, a non-conductive film, and combinations thereof. The underfill layer 630 can further encapsulate the die 620 for better protection. The solder balls 670 are disposed on redistribution layer 614b of the interposer 610. A material of the solder balls 670 can include copper, gold, nickel, tin, lead, silver, platinum, and/or aluminum.

The semiconductor package 1200 shown in FIG. 6B is substantially the same as the semiconductor package 600 shown in FIG. 6A, and only the different portions of the two semiconductor packages are described below, and the same portions will not be repeated herein.

The semiconductor package 1200 includes an interposer 1210, a semiconductor die 1220 integrating CMOS circuit and controller circuit, and a memory stack 1240. Specifically, the memory stack 1240 is disposed on the upper surface of the interposer 1210 and includes a plurality of memory dies 1242 stacked on each other or vertically stacked in a flip-chip manner. In particular, each of the plurality of memory dies 1242 in the memory stack 1240 includes a plurality of through silicon vias 1244 to enable electrical interconnection between the plurality of memory dies and the interposer. Alternatively, the memory die may be provided with a string of memory functional circuit layers, which are arranged on each other and electrically interconnected via through silicon vias. It is noted that the memory stack 1240 stacked on each other using the through silicon vias can achieve increasing numbers of layers of the memory stack without increasing the footprint of the memory stack, with compared to stacks using the wire bonds (as shown in FIGS. 5A and 5B). As a result, the footprint and the volume of the package are further reduced, for ease of three-dimensional integration. In such case, the size of the semiconductor package 1200 can be adjusted based on different package types of the memory die stacks with better flexibility.

In addition to the memory stack 1240, the semiconductor package 1200 may include at least one memory stack. At least one memory stack is disposed on an upper surface of the interposer 1210 and controlled by means of at least one hybrid flip chip 1230 disposed at a lower surface of the interposer 1210. It is noted that the stacked manners of two or more memory stacks may be different.

Figure 7:
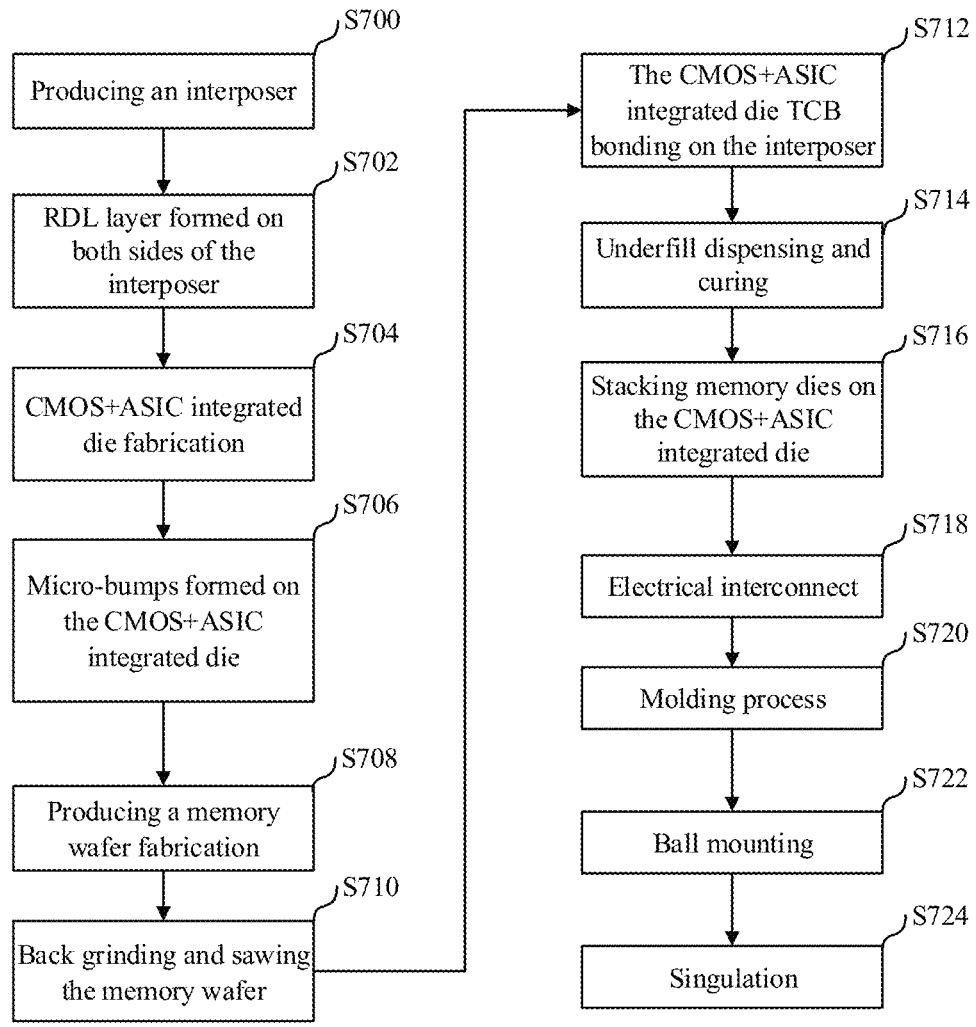
FIG. 7 is a flow chart of a fabricating method of a semiconductor package shown in FIG. 5A.
Figure 8A:
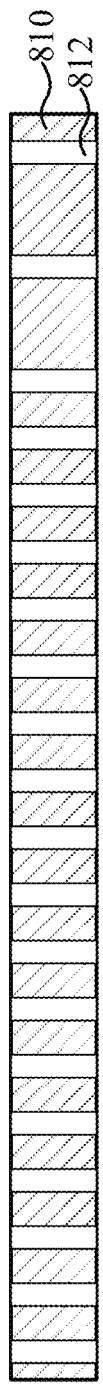
FIGS. 8A-8H are schematic side views showing various stages of the fabricating method shown in FIG. 7.

Referring to FIG. 7, in step S700, an interposer is provided. As shown in FIG. 8A, a plurality of through silicon vias (TSVs) 812 vertically interconnected through the interposer 810 are formed. The interposer 810 may be composed of a material such as silicon, and each of the through silicon vias 812 may first be formed as vias by plasma etching or laser drilling, and then filled with metal material such as copper. Optionally, a dielectric layer, a barrier layer, and/or a seed layer may be deposited after forming the vias. Optionally, chemical mechanical polishing is performed after filling the metal material.

Figure 8B:
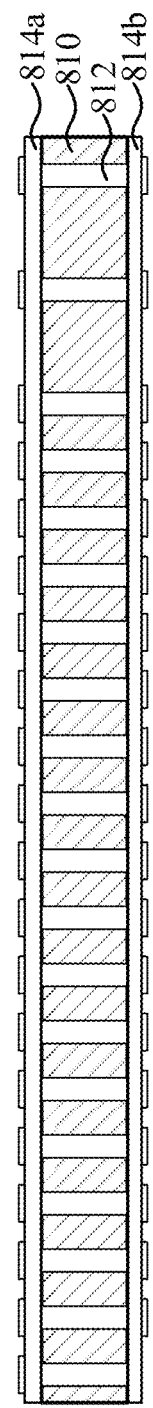

In step S702, redistribution layers (RDLs) are formed on both surfaces of the interposer respectively. As shown in FIG. 8B, redistribution layers 814a, 814b may be formed on the upper and lower surfaces of the interposer 810, respectively, for example by physical or chemical etching, metal plating, etc., in order to be subsequently adapted to the layout of the micro-bumps on the hybrid flip-chip and to the wire bonds of the memory die stack. It should be known that the wire bonds are only exemplary. In alternative embodiments, other electrical interconnectors, such as solder, micro-bumps, and TSVs, can be selected.

In step S704, a semiconductor die integrating CMOS circuit and controller circuit is fabricated on a wafer. Specifically, the die can be fabricated by semiconductor processes, such as doping, diffusion, photolithography, ion implantation, and development.

Next, in step S706, the micro-bumps 822 are formed on the surface of the die 820.

In step S708, memory wafers are provided. Then in step S710, the memory wafers are back grinded and sawed to form the memory dies. Each memory die does not include CMOS circuits.

Figure 8C:
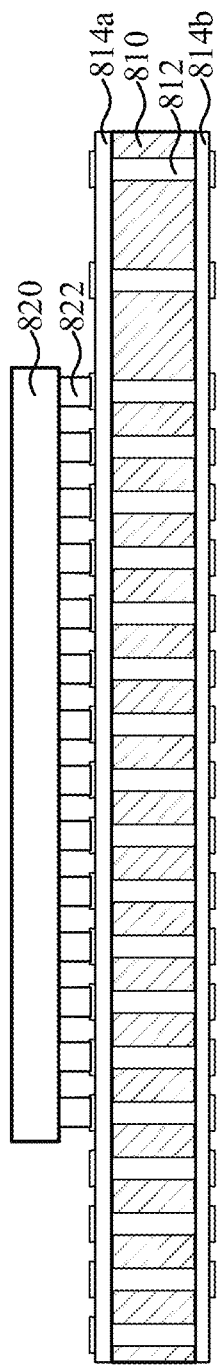

In step S712, the die 820 is mounted on the interposer 810 by thermal compression bonding. As shown in FIG. 8C, the micro-bumps 822 and the redistribution layer 814a are bonded by a flip-chip process, and the die 820 are disposed on the interposer 810, so that data and signals are transmitted to the interposer 810 via the micro-bumps 822.

Figure 8D:
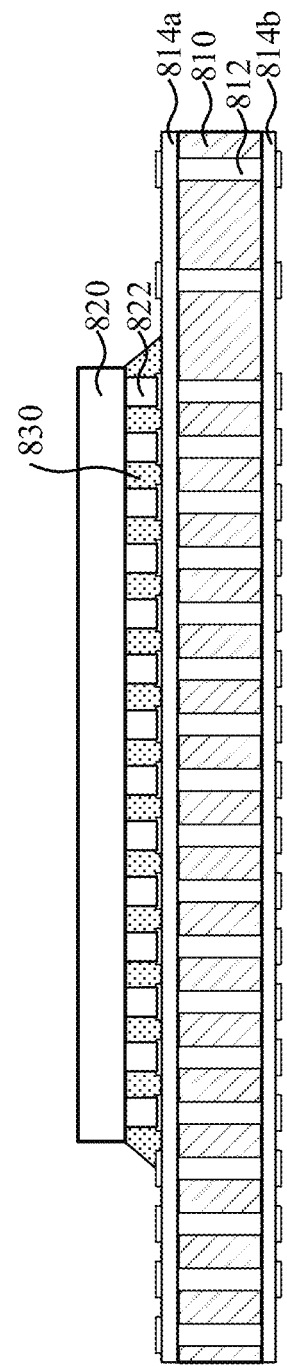

In step S714, an underfill is dispensed and cured between the die 820 and the interposer 810. Specifically, as shown in FIG. 8D, an underfill layer 830 is formed and cured between the CMOS circuit and controller integrated die 820 and the redistribution layer 814a to cover gaps between all the micro-bumps 822.

Figure 8E:
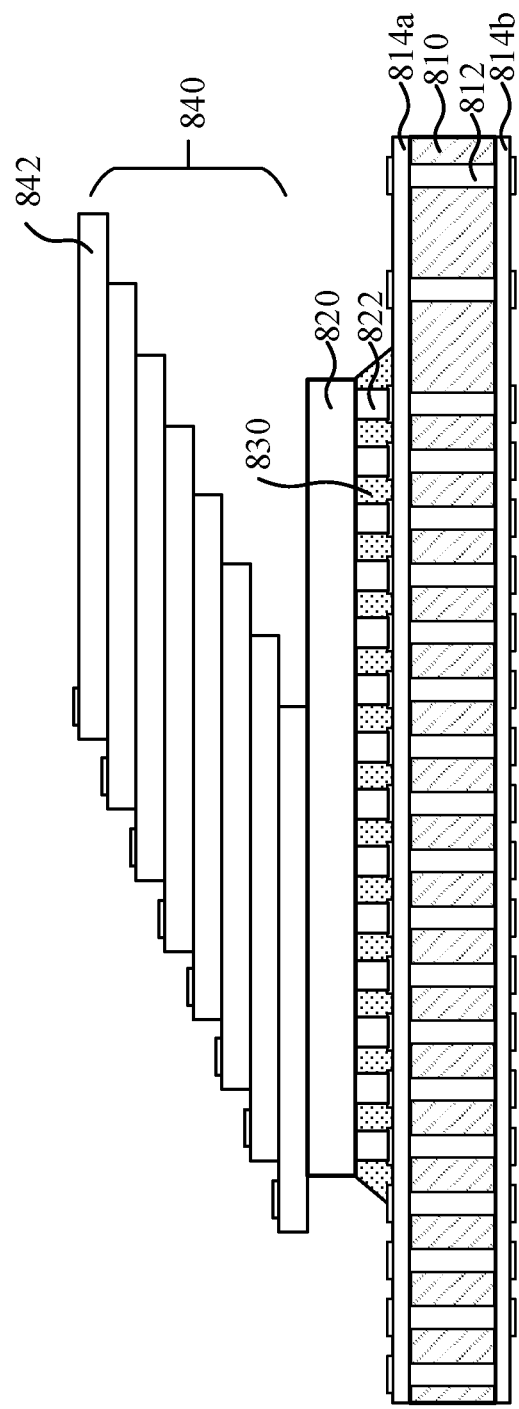

In step S716, memory dies 840 are stacked on the die 820. Specifically, as shown in FIG. 8E, each of the memory dies 842 in the memory die stack 840 is offset to the right along the surface direction by a small distance and is stacked in the form of stairs to form the memory die stack 840. In other embodiments, the memory die stack can also be formed by other stacked forms, for example, the plurality of memory dies may be offset in any direction along a plane in which the surface of the die is located, or be offset in two or more directions along the plane. In addition, a flip-chip memory die stack 840 can also be formed in a similar manner to the hybrid flip chip, in which individual memory dies are electrically connected with each other by through silicon vias. The memory die located in a lowest layer of the memory die stack 840 is electrically interconnected to the redistribution layer 810a on the interposer 810 by the micro-bumps.

Figure 8F:
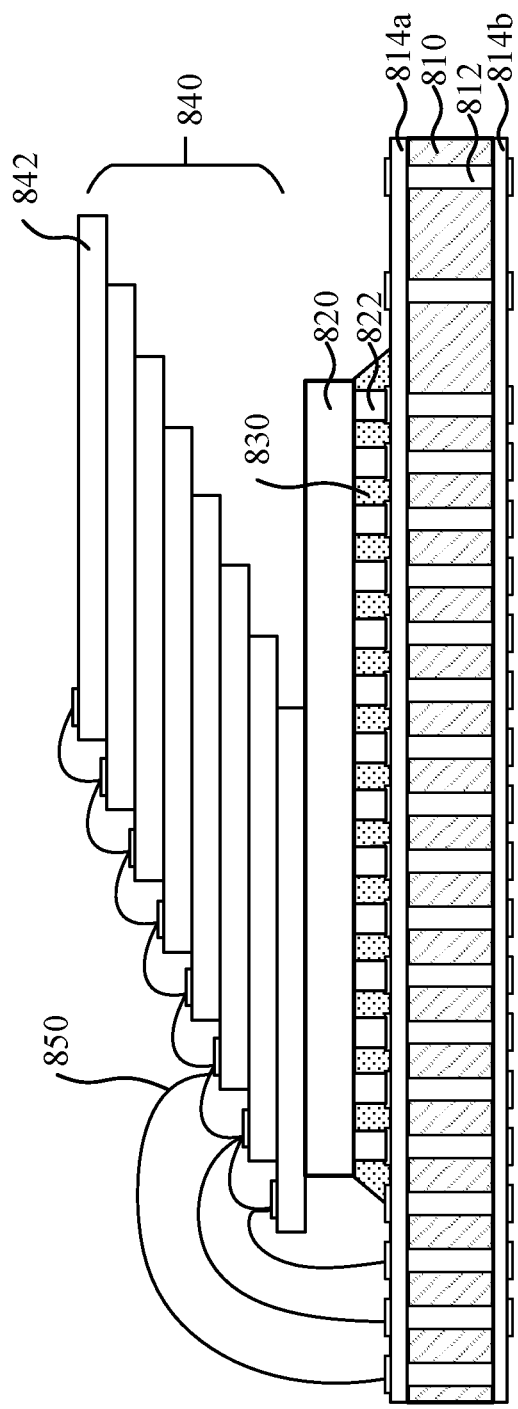

In step S718, each of the memory dies in the memory die stack is electrically interconnected with the redistribution layer by electrical interconnectors. Specifically, as shown in FIG. 8F, each of the memory dies 842 in the memory die stack 840 is electrically interconnected with each other by wire bonds 850 and electrically interconnected to the redistribution layer 814a by the wire bonds 850, for transmitting data and signals to the interposer 810.

Figure 8G:
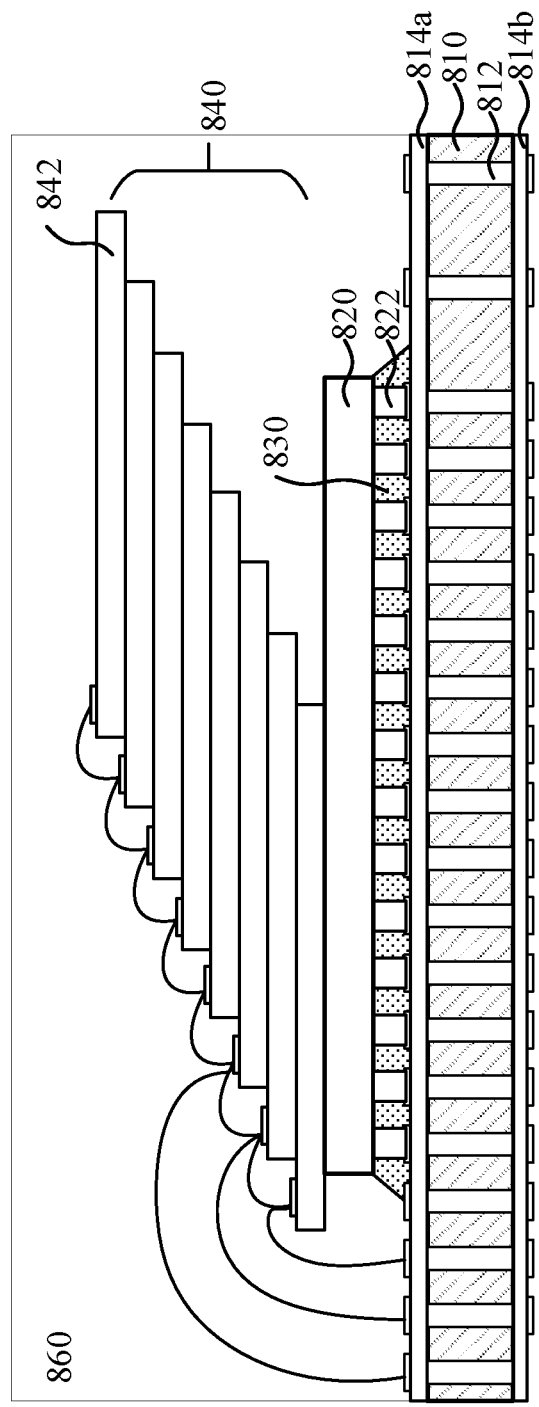

In step S720, a molding process is performed. Specifically, as shown in FIG. 8G, the die 820 having the micro-bumps 822, the underfill layer 830, the memory die stack 840, and the wire bonds 850 are encapsulated by a molding compound 860.

Figure 8H:
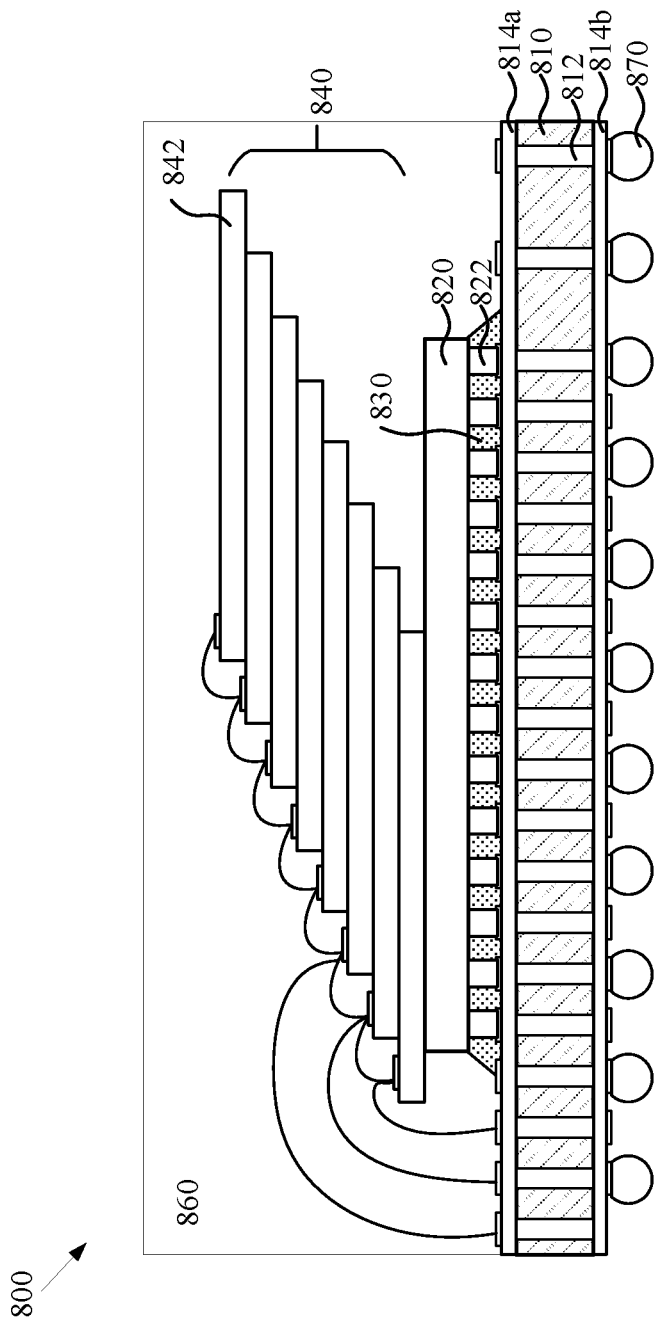

In step S722, solder balls are mounted. As shown in FIG. 8H, solder balls 870 can be mounted onto the redistribution layer 814b. Solder balls 870 can be used to mount the semiconductor package 800 to a semiconductor device (not shown), such as a printed circuit board. Alternatively, the semiconductor package 800 can be mounted to at least one other semiconductor package.

In step S724, the semiconductor package is singulated by various cutting methods, thereby forming the semiconductor package 800 as shown in FIG. 8H. Various cutting methods include sawing, laser cutting, water jet cutting, water guided laser cutting, dry media cutting, and diamond coated wire cutting. Although the linear cutting substantially defines a rectangular parallelepiped shape, a cube shape or a rhombohedral shape of the semiconductor package 800, it is contemplated that the semiconductor package 800 may have other shapes.

A fabricating method of the semiconductor package shown in FIG. 6A will be described as following, but the description of the steps is the same as those described in the fabricating method of the semiconductor package shown in FIG. 5A will be omitted hereinafter.

Figure 9:
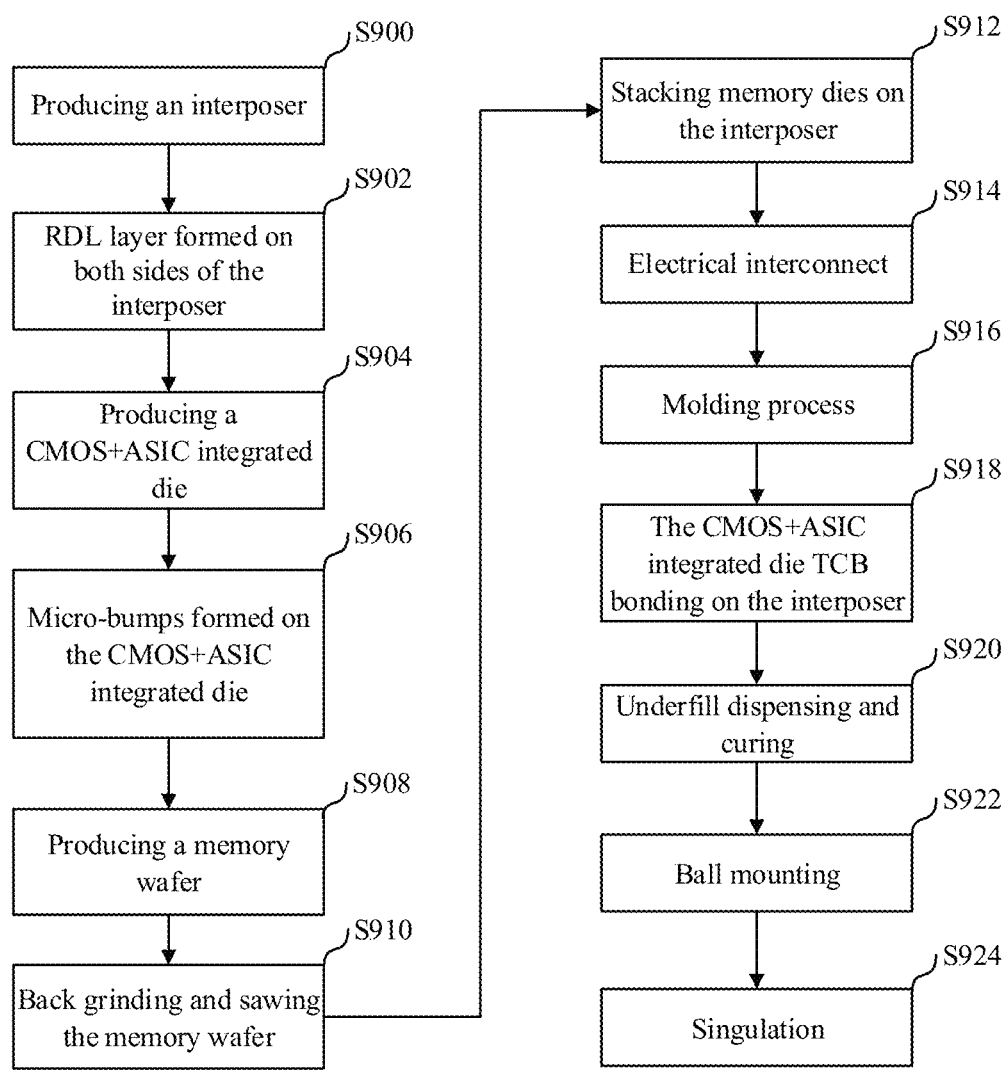
FIG. 9 is a flow chart of a fabricating method of a semiconductor package shown in FIG. 6A.

Referring to FIG. 9, because the steps S900 to S910, and S924 are substantially the same as the those of steps S700 to S710, and S724, the description thereof will not be repeated herein.

Figure 10A:
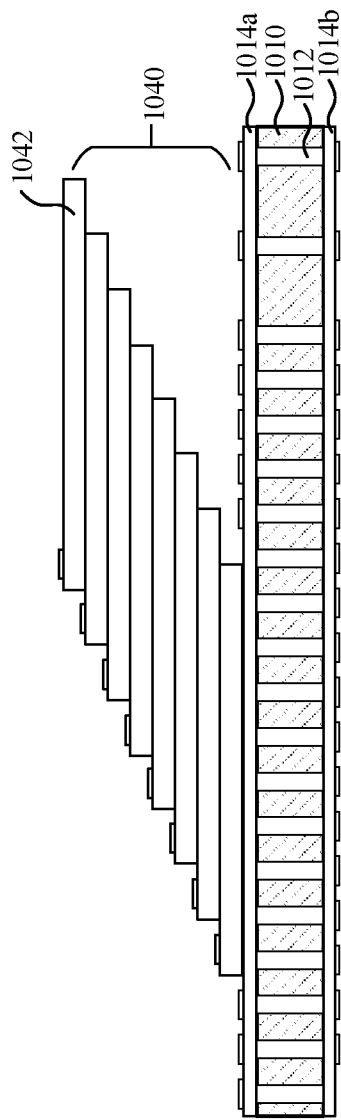
FIGS. 10A-10F are schematic side views showing various stages of the fabricating method shown in FIG. 9.

Referring to FIG. 9, in step S912, the memory dies are stacked on the upper surface of the interposer. Specifically, as shown in FIG. 10A, the memory dies 1042 are stacked on the redistribution layer 1014a at the upper surface of the interposer 1010 having the through silicon vias 1012.

Figure 10B:
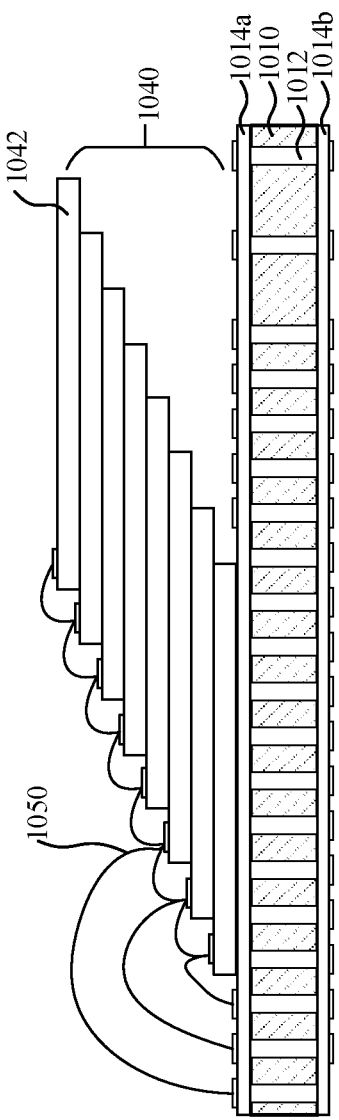

In step S914, each of the memory dies in the memory die stack is electrically interconnected to the redistribution layer by electrical interconnectors. Specifically, as shown in FIG. 10B, each of the memory dies 1042 in the memory die stack 1040 is electrically interconnected to each other by wire bonds, and is also electrically interconnected to the redistribution layer 1014a by wire bonds 1050 to transmits data and signals with the interposer.

Figure 10C:
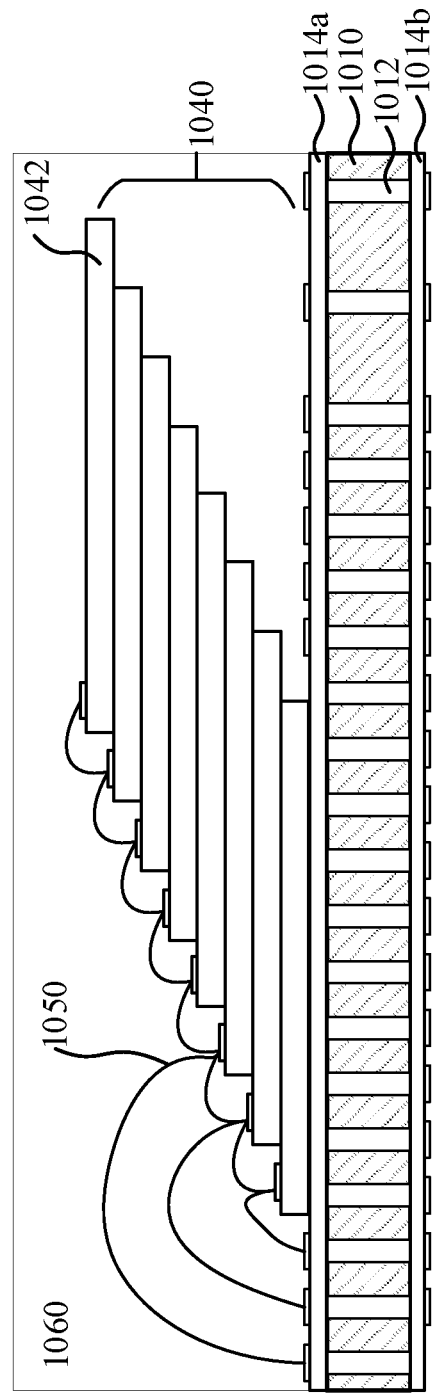

In step S916, a molding process is performed. Specifically, as shown in FIG. 10C, the memory die stack 1040 and the wire bonds 1050 are encapsulated by a molding compound 1060.

Figure 10D:
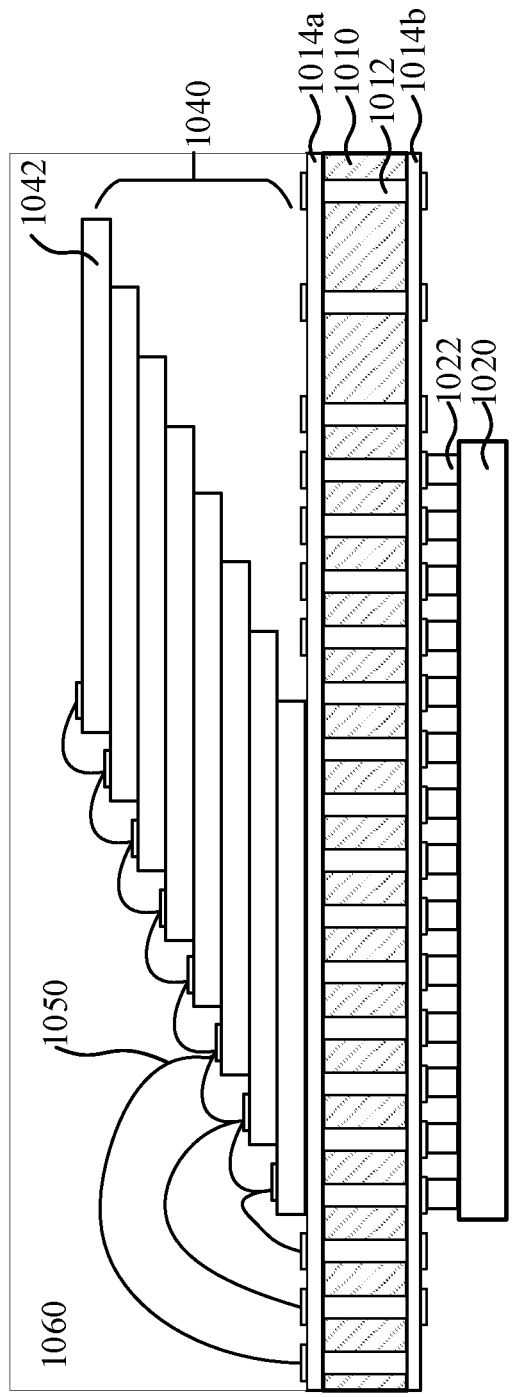

In step S918, the die 1020 is mounted on the interposer by thermal compression bonding. Specifically, as shown in FIG. 10D, the micro-bumps 1022 are electrically coupled to the redistribution layer 1014b at the lower surface of the interposer 1010, and the die 1020 are disposed on the lower surface of the interposer 1010, so as to transmit data and signals with the interposer 1010 via the micro-bumps 1022.

Figure 10E:
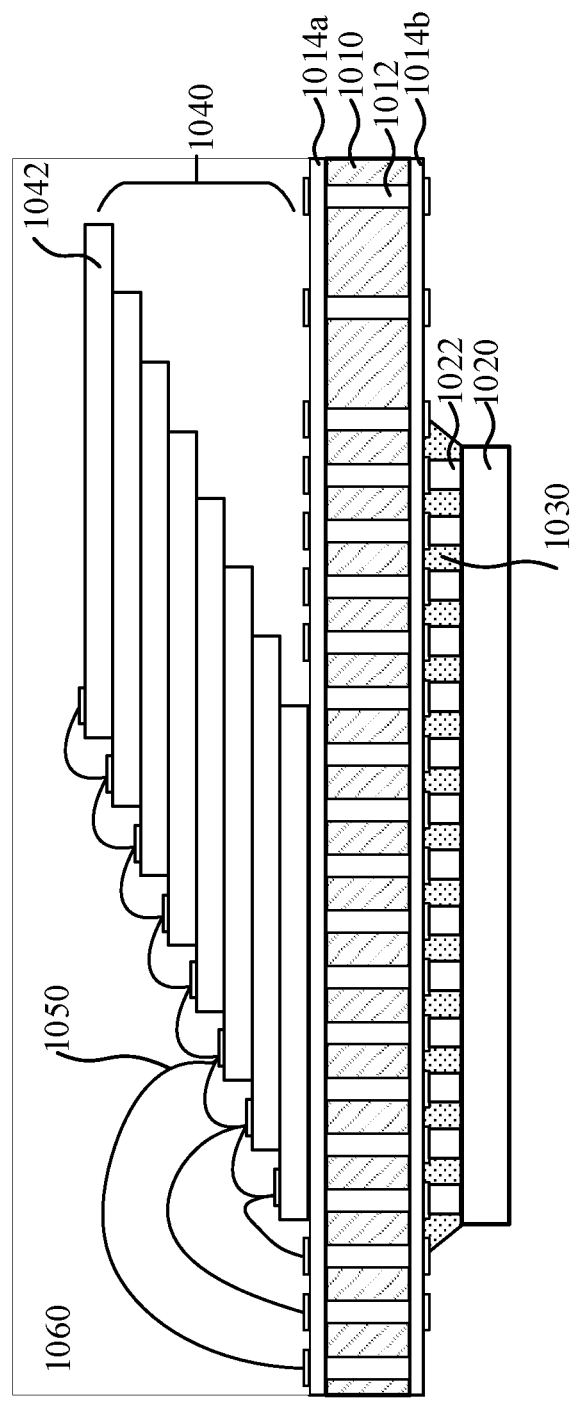

In step S920, the underfill is dispensed and cured between the die 1020 and the interposer 1010. Specifically, as shown in FIG. 10E, a underfill layer 1030 is formed between the die 1020 and the redistribution layer 1014b to cover gaps between the micro-bumps 1022.

Figure 10F:
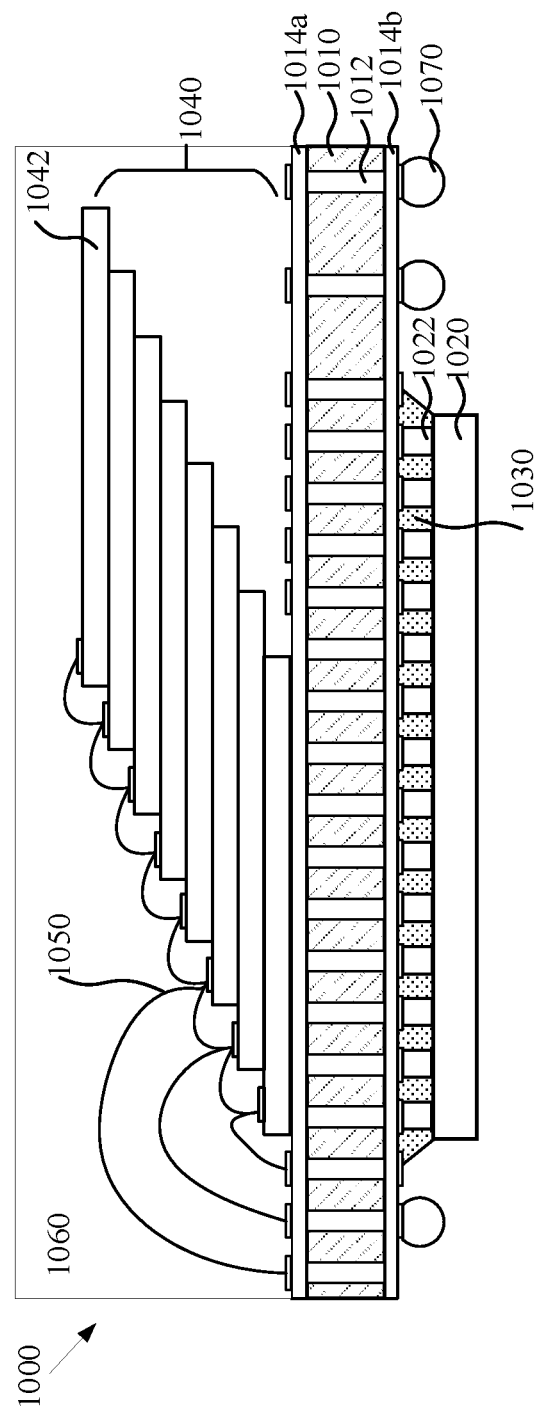

In step S922, solder balls are mounted. As shown in FIG. 10F, solder balls 1070 can be mounted to portions of the redistribution layer 1014b beyond the die 1020 at the lower surface of the interposer 1010. The solder balls 1070 can be configured to further mount the semiconductor package 1000 for example to a printed circuit board of a host device.

According to one aspect, a semiconductor die is provided. The semiconductor die comprises: at least one complementary metal oxide semiconductor (CMOS) circuit module electrically coupled to at least one memory die, the at least one memory die being separated from the semiconductor die; and a controller module electrically coupled to the CMOS module and configured to control the at least one CMOS module and the at least one memory die.

According to another aspect, a semiconductor die is provided. The semiconductor die comprises: a base layer; at least one complementary metal oxide semiconductor circuit (CMOS) disposed on a first side of the base layer and configured to communicate with at least one memory die. The at least one memory die is separated from the semiconductor die; a controller circuit disposed on the first side of the base layer and configured to control the at least one CMOS and the at least one memory die; output terminals disposed over the at least one CMOS and the controller circuit, and electrically interconnected with the at least one CMOS and the controller circuit; and conductive connectors disposed over each of the output terminals.

According to an embodiment, the at least one CMOS comprises an address and/or command control circuitry and is configured to communicate with the at least one memory die to transmit address and/or command signals.

According to an embodiment, the at least one CMOS circuit comprises a logic control array circuit and/or an analog circuit.

According to an embodiment, the controller circuit is configured as an application specific integrated circuit (ASIC).

According to an embodiment, the controller circuit and the at least one CMOS are disposed in the same layer.

According to an embodiment, the controller circuit and the at least one CMOS are disposed on top of each another.

According to an embodiment, the conductive connectors comprise micro-bumps.

According to an embodiment, a material of the micro-bumps comprises copper, gold, nickel, tin, lead, silver, platinum, and/or aluminum.

According to another aspect, a semiconductor package is provided. The semiconductor package comprises: an interposer having a first surface and a second surface opposite to the first surface; a semiconductor die disposed on the first surface of the interposer; and at least one memory die, disposed over the first surface of the interposer and on the semiconductor die, or disposed on the second surface of the interposer. The semiconductor die comprises: a base layer; at least one complementary metal oxide semiconductor (CMOS) circuits, disposed on a first side of the base layer and configured to communicate with at least one memory die. The at least one memory die is separated from the semiconductor die; a controller circuit, disposed on the first side of the base layer and configured to control the at least one CMOS circuit and the at least one memory die; output terminals disposed over the at least one CMOS circuit and the controller circuit, and electrically interconnected with the at least one CMOS circuit and the controller circuit; and conductive connectors disposed over each of the output terminals.

According to an embodiment, the semiconductor package does not comprise a substrate.

According to an embodiment, the memory die is a three-dimensional memory die, and does not include a CMOS circuit module.

According to an embodiment, the interposer has a plurality of through silicon vias filled with metal.

According to an embodiment, the package further comprises redistribution layers disposed on the first surface and the second surface of the interposer respectively so as to electrically interconnected with the conductive connectors of the semiconductor die and the at least one memory die, respectively.

According to an embodiment, the semiconductor package comprises an underfill layer disposed between the redistribution layer and the semiconductor die to cover all of the conductive connectors.

According to an embodiment, the semiconductor package comprises a molding compound encapsulating the at least one memory die and/or the semiconductor die on the interposer.

According to another aspect, a fabricating method of a semiconductor package is provided. The method comprises following steps of: a) providing an interposer having a first surface and a second surface opposite to the first surface; b) providing a semiconductor die; c) disposing the semiconductor die on the first surface of the interposer; d) providing at least one memory die, the at least one memory die is separated from the semiconductor die; e) disposing the at least one memory die on the semiconductor die or on the second surface of the interposer; providing the semiconductor die comprises: providing a base layer; forming at least one CMOS circuit on a first side of the base layer; forming a controller circuit on the first side of the base layer, the circuit is configured to control the at least one CMOS circuit and the at least one memory die; forming output terminals over the at least one CMOS circuit and the controller circuit, the output terminals are electrically interconnected with the at least one CMOS circuit and the controller circuit; and forming conductive connector over each of the output terminals.

It will be appreciated that aspects of the invention may be combined such that features described in one aspect may be implemented in another aspect.

In the present embodiment, a CMOS circuit module comprising a logic control array circuit module and/or an analog circuit module and a controller module for managing the at least one memory die are integrated in a single semiconductor die separated from a memory die. Therefore, an influence of the CMOS circuit on thermal and mechanical properties of each memory die can be significantly reduced. And since a data processing speed of the CMOS circuit and an operating speed of the controller are much greater than the operating speed of the memory die, integrating the CMOS circuit and the controller circuit in the semiconductor die can enable more efficient data management operations.

Since each memory die does not include a CMOS circuit, thus enabling the further increase of the memory integration density of the 3D memory die, and the fabricating cost of the memory dies can be reduced. The substrate can generally include a dielectric base having conductive layer(s) etched on one or both sides. And, since the CMOS circuit and the controller are integrated in one semiconductor die, the CMOS circuit and the controller circuit are integrated in one semiconductor die, the size of the semiconductor die can be greater than the size of the conventional controller die, thus the semiconductor die can be placed directly below the memory die stack without additional support structures such as spacers placed around the controller die, thereby improving yield and reducing process complexity.

It is understood that the foregoing general description and the following detailed description of the present embodiment are exemplary, and are intended to provide to provide further explanation that the claimed technology.

We claim:

1. A semiconductor die, comprising:
   a base layer;
   at least one complementary metal oxide semiconductor (CMOS) circuit disposed on a first side of the base layer and configured to communicate with at least one memory die, wherein the at least one memory die is separated from the semiconductor die;
   a controller circuit disposed on the first side of the base layer and configured to control the at least one CMOS circuit and the at least one memory die;
   output terminals disposed over the at least one CMOS circuit and the controller circuit, and electrically interconnected with the at least one CMOS circuit and the controller circuit; and
   conductive connectors disposed over each of the output terminals.

2. The semiconductor die according to claim 1, wherein the at least one CMOS circuit comprises an address and/or command control circuitry and is configured to communicate with the at least one memory die to transmit address and/or command signals.

3. The semiconductor die according to claim 1, wherein the at least one CMOS circuit comprises a logic control array circuit and/or an analog circuit.

4. The semiconductor die according to claim 1, wherein the controller circuit is configured as an application specific integrated circuit (ASIC).

5. The semiconductor die according to claim 1, wherein the controller circuit and the at least one CMOS circuit are disposed in the same layer.

6. The semiconductor die according to claim 1, wherein the controller circuit and the at least one CMOS circuit are disposed on top of each another.

7. The semiconductor die according to claim 1, wherein the conductive connectors comprise micro-bumps.

8. A semiconductor package, comprising:
   an interposer having a first surface and a second surface opposite to the first surface;
   a semiconductor die disposed on the first surface of the interposer; and
   at least one memory die disposed over the first surface of the interposer and on the semiconductor die, or disposed on the second surface of the interposer;
   wherein the semiconductor die comprises:
   a base layer;
   at least one complementary metal oxide semiconductor (CMOS) circuits, disposed on a first side of the base layer and configured to communicate with at least one memory die, wherein the at least one memory die is separated from the semiconductor die;
   a controller circuit, disposed on the first side of the base layer and dedicated to control the at least one CMOS circuit and the at least one memory die;
   output terminals disposed over the at least one CMOS circuit and the controller circuit, and electrically interconnected with the at least one CMOS circuit and the controller circuit; and
   conductive connectors disposed over each of the output terminals.

9. The semiconductor package according to claim 8, wherein the semiconductor package does not comprise a substrate.

10. The semiconductor package according to claim 8, wherein the at least one CMOS circuit comprises an address and/or command control circuitry and is configured to communicate with at least one memory die to transmit address and/or command signals.

11. The semiconductor package according to claim 8, wherein the at least one CMOS circuit comprises a logic control array circuit and/or an analog circuit.

12. The semiconductor package according to claim 8, wherein the controller circuit is configured as an application specific integrated circuit (ASIC).

13. The semiconductor package according to claim 8, wherein the controller circuit and the at least one CMOS circuit are disposed in the same layer.

14. The semiconductor package according to claim 8, wherein the controller circuit and the at least one CMOS circuit are disposed on top of each another.

15. The semiconductor package according to claim 8, wherein the conductive connectors comprise micro-bumps.

16. The semiconductor package according to claim 8, wherein the at least one memory die comprises a plurality of memory dies stacked on top of each other.

17. The semiconductor package according to claim 8, wherein the memory die is a three-dimensional memory die, and does not include a CMOS circuit.

18. The semiconductor package according to claim 8, wherein the at least one memory die is disposed on the second surface of the interposer, the semiconductor package further comprising redistribution layers disposed on the first surface and the second surface of the interposer respectively so as to electrically interconnected with the conductive connectors of the semiconductor die and the at least one memory die, respectively.

19. The semiconductor package according to claim 18, further comprising an underfill layer disposed between the redistribution layer and the semiconductor die to cover all of the conductive connectors.

20. The semiconductor package according to claim 8, further comprising a molding compound encapsulating the at least one memory die and/or the semiconductor die on the interposer.

* * * * *